United States Patent [19]

Komoda

[11] Patent Number: 4,982,443
[45] Date of Patent: Jan. 1, 1991

[54] INSTANTANEOUS VOLTAGE DROP DETECTOR FOR DC POWER SOURCE

[75] Inventor: Motoyoshi Komoda, Tokyo, Japan

[73] Assignee: NEC Corporation, Tokyo, Japan

[21] Appl. No.: 291,020

[22] Filed: Dec. 28, 1988

[30] Foreign Application Priority Data

Dec. 28, 1987 [JP] Japan ................................ 62-329797

[51] Int. Cl.⁵ ............................................ H01Q 11/12
[52] U.S. Cl. .................................... 455/117; 455/127; 455/343
[58] Field of Search ................. 455/73, 117, 127, 343; 379/61; 323/280, 284, 288

[56] References Cited

U.S. PATENT DOCUMENTS

| | | | |
|---|---|---|---|
| 4,242,753 | 12/1980 | Dolikian et al. | 455/117 |
| 4,274,132 | 6/1981 | Molyneux-Berry | 455/127 |
| 4,709,404 | 11/1987 | Tamura et al. | 455/73 |
| 4,761,824 | 8/1988 | Saito | 455/117 |
| 4,766,580 | 8/1988 | Go et al. | 455/127 |

Primary Examiner—Reinhard J. Eisenzopf
Assistant Examiner—Lisa Charouel
Attorney, Agent, or Firm—Sughrue, Mion, Zinn, Macpeak & Seas

[57] ABSTRACT

An instantaneous voltage drop detector includes a reset signal generating circuit which generates a low-level reset signal when a DC power voltage falls below a predetermined level. When the reset signal exists, an integrating circuit discharges the electric charge charged thereon in accordance with its time constant. If the reset signal disappears, i.e., the output of the reset signal generating circuit changes to a high level, a changing circuit rapidly charges the integrating circuit to avoid interference between instantaneous voltage drops which continuously occur at a short interval. The detector also includes a comparator which compares the output level of the integrating circuit with a reference level and a latch circuit (E/F) which latches the output of the comparator in response to the disappearance of the reset signal, i.e., in response to the positive-going edge of output of the reset signal generating circuit. With the foregoing construction, the instantaneous voltage drop detector can accurately distinguish the continuously occurred instantaneous voltage drops from a long-period voltage drop.

9 Claims, 7 Drawing Sheets

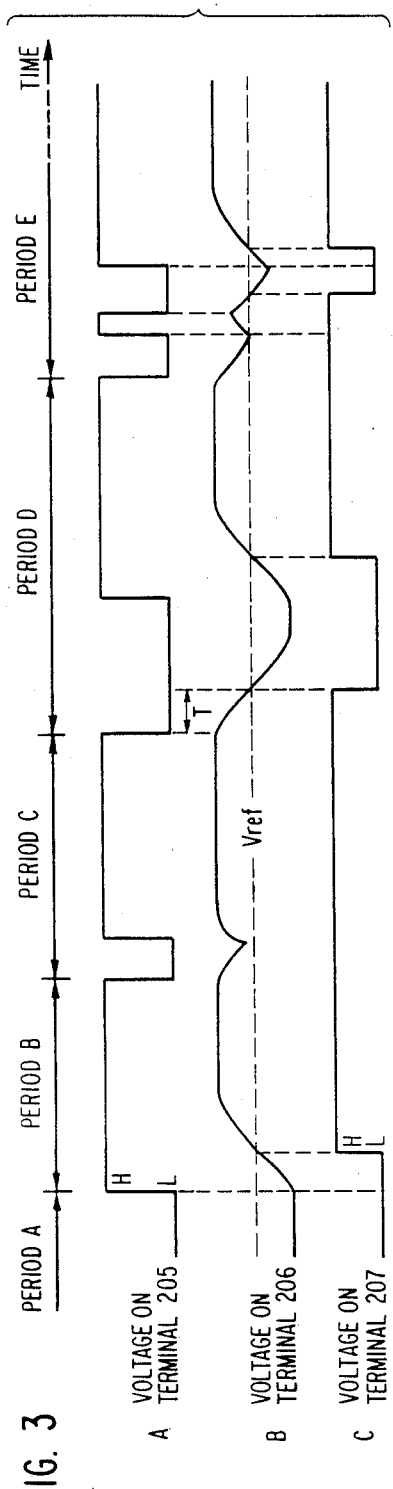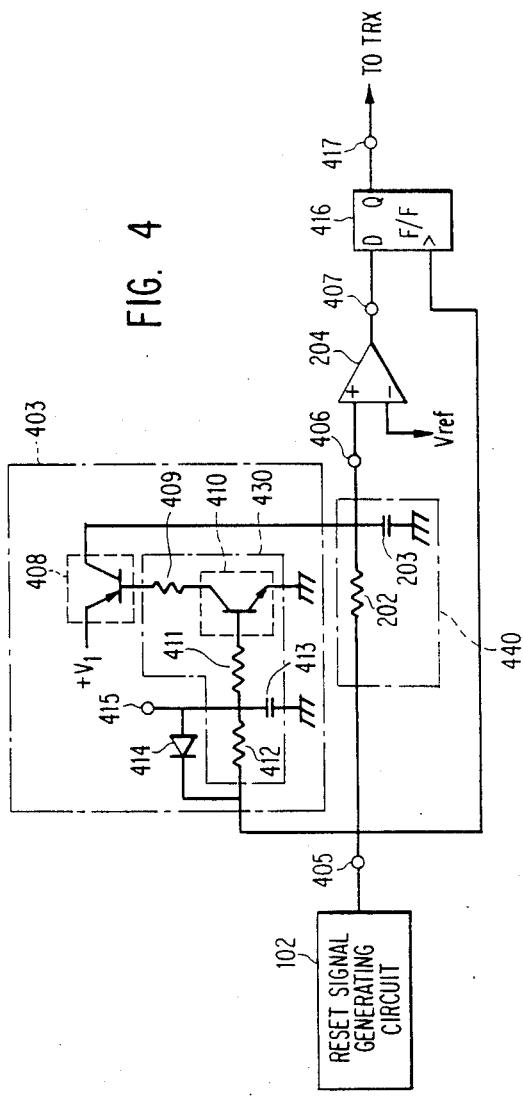

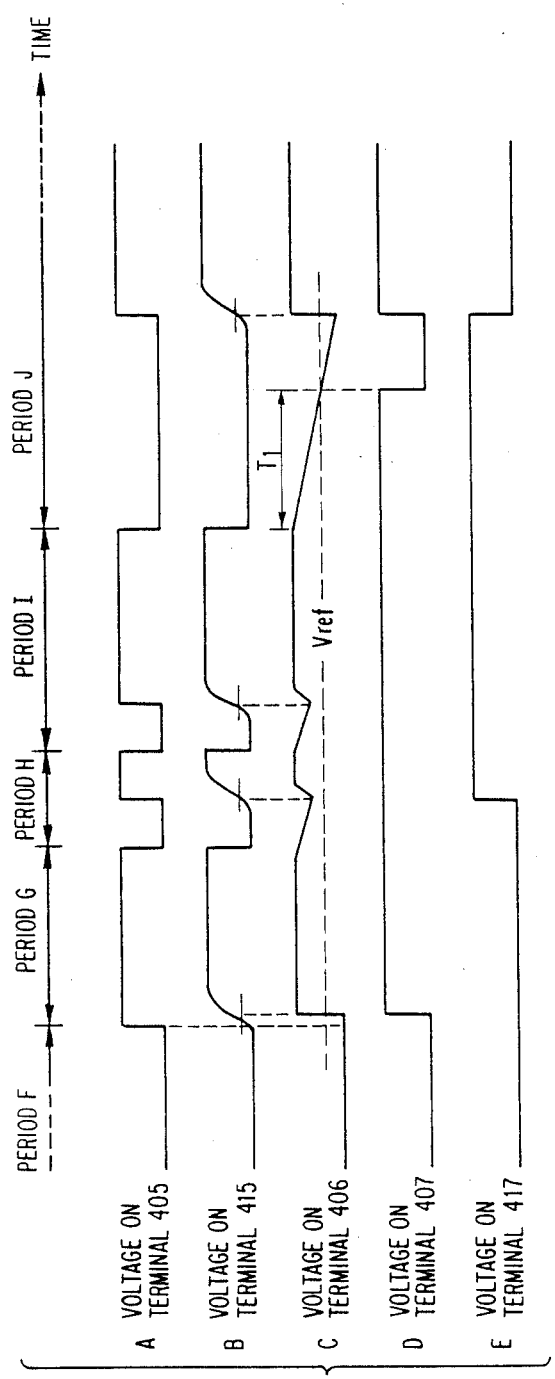

INSTANTANEOUS VOLTAGE DROP DETECTOR FOR DC POWER SOURCE

BACKGROUND OF THE INVENTION

The present invention relates to a device for detecting instantaneous voltage drops of a DC power source and, more particularly, to an improvement in an instantaneous voltage drop detector for use in a mobile radiotelephone for detecting a voltage drop of an on-board DC power source which drops ends within a predetermined period of time, i.e. an instantaneous voltage drop as will be referred to hereinafter.

A mobile radiotelephone is powered by a battery which is mounted on a motor vehicle. When a starting motor of a motor vehicle is driven to start an engine, a current of several tens of amperes flows so that the voltage of an on-board battery is temporarily lowered below a predetermined level by the internal resistance of the battery and cables. The phenomenon whereby the voltage undergoes such a drop and is restored to normal within a predetermined period of time (hereinafter referred to as instantaneous voltage drop decision time or simply decision time) such as three seconds is generally referred to as an instantaneous voltage drop.

When the voltage of a power source associated with a mobile radiotelephone drops below a predetermined level even for a short time, the radio section of the radiotelephone is rendered immediately inoperable. Therefore, when an instantaneous voltage drop occurs in an on-board battery or power source as stated above, the radio section remains inoperable even after the restoration of the source voltage. During this time the radiotelephone is out of communication with a central station, simply wasting the communication channel. In light of this, a modern mobile radiotelephone system is provided with an instantaneous voltage drop detector for detecting an instantaneous voltage drop. When an output of the detector shows that an instantaneous voltage drop has occurred, the radio section is energized to cause the radiotelephone to again communicate with the central station.

A prior art instantaneous voltage drop detector of the kind described is constructed as follows. A source voltage lowered below a predetermined level is sensed by a reset circuit. The resulting low-level output of the reset circuit is applied to one input terminal of a comparator via an integrator so as to be compared with a reference voltage which is fed to the other input terminal of the comparator. The result of comparison outputted by the comparator is used to detect the instantaneous voltage drop, i.e., a discharging time constant of the integrator defines an instantaneous voltage drop decision time. For details of such a technique, reference may be made to U.S. patent application Ser. No. 07/158,610.

However, the prior art instantaneous voltage drop detector is not capable of detecting continuously occurring instantaneous voltage drops with accuracy. More specifically, the charging and discharging time constants of the integrator installed in the prior art detector are equal to each other. Hence, when an instantaneous voltage drop is followed by another instantaneous voltage drop before the amount of electric charge discharged from the integrator due to the preceding voltage drop is charged again in the integrator, the voltage level applied to the comparator is apt to remain lower than the reference level despite the fact that the voltage drops are instantaneous.

SUMMARY OF THE INVENTION

It is therefore an object of the present invention to provide an instantaneous voltage drop detector capable of surely detecting instantaneous voltage drops of a DC power source inclusive of those which occur in close succession over a short interval.

In accordance with the present invention, a device for detecting an instantaneous voltage drop of a DC power source comprises first means for producing a low-level signal having a duration associated with a period of time in which a voltage of the power source remains lower than a predetermined level, and a high level-signal having a duration associated with a period of time in which the voltage of the power source remains higher than the predetermined level, second means for performing a discharging operation based on a first time constant in response to the low-level signal and a charging operation based on a second time constant smaller than the first time constant in response to the high-level signal, the second means producing a first signal having levels which are individually associated with the charging operation and the discharging operation, and third means for detecting that the voltage of the power source has become lower than the predetermined level by comparing the level of the first signal with a reference voltage level.

Further, in accordance with the present invention, a device for detecting an instantaneous voltage drop of a DC power source comprises a reset signal generating means for generating a reset signal by detecting a drop of a voltage of the power source below a predetermined level and clearing the reset signal by sensing a rise of the voltage of the power source above the predetermined level, a charging and discharging means for determining a period of time during which the voltage of the power source remains lower than the predetermined level, first means for charging the charging and discharging means when the reset signal is produced, second means for comparing a voltage of the charging and discharging circuit with a predetermined reference voltage when the reset signal is cleared and memorizing a result of the comparison, and third means for rapidly charging the charging and discharging means after the second means has memorized the result of the comparison.

BRIEF DESCRIPTION OF THE DRAWINGS

The above and other objects, features and advantages of the present invention will become more apparent from the following detailed description taken with the accompanying drawings in which:

FIG. 3 shows timing charts showing voltages which appear on terminals 205, 206 and 207 of the circuitry shown in FIG. 2, respectively;

FIG. 4 is a diagram schematically showing an instantaneous voltage drop detector embodying the present invention;

FIG. 5 shows timing charts showing voltages which appear on terminals 405, 415, 406, 407 and 417 of the circuity shown in FIG. 4, respectively;

DETAILED DESCRIPTION OF THE PREFERRED EMBODIMENTS

To better understand the present invention, brief reference will be made to a mobile radiotelephone to which the present invention is applicable as well as to a prior art instantaneous voltage drop detector for a DC power source.

Figure 1:
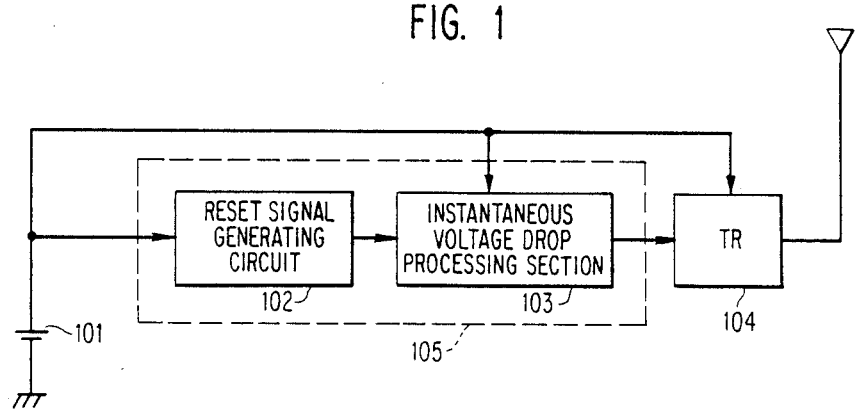
FIG. 1 is a schematic block diagram of a mobile radiotelephone to which the present invention is applicable.

Referring to FIG. 1, a mobile radiotelephone is powered by a battery 101 which is mounted on a motor vehicle. A DC power source detecting device, generally 105, includes a reset signal generating circuit 102 and an instantaneous voltage drop processing section 103. A transmitter/receiver (TR) 104 includes a voice input and output unit. Power is applied from the DC power source 101 to the instantaneous voltage drop processing section 103 and TR 104 for driving them.

In the above construction, the reset signal generating circuit 102 produces a reset signal (a low-level signal, for example) upon sensing a fall of the output voltage level of the DC power source 101 below a predetermined level, and clears the reset signal, that is, produces a high-level signal, for example, upon sensing the rise of the voltage above the predetermined level. As the instantaneous voltage drop processing section 103 detects an instantaneous voltage drop as represented by an output of the reset signal generating circuit 102, it delivers various control signals such as a command for activating the TR 104. In response, the TR 104 is activated again to allow the radiotelephone to hold a communication with the central station.

Figure 2:
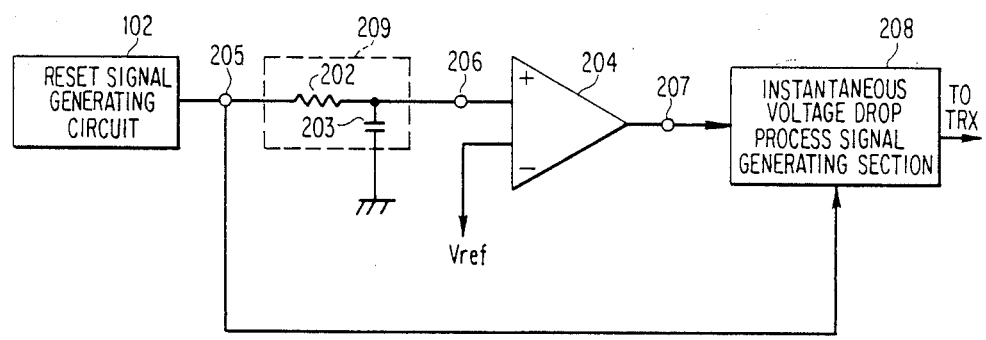
FIG. 2 is a schematic diagram showing a prior art instantaneous voltage drop detector for use with a DC power source.

The instantaneous voltage drop detector 105 shown in FIG. 1 has customarily been implemented by circuitry shown in FIG. 2. In the figure, there are shown the reset signal generating circuit 102, a resistor 202, a capacitor 203, a voltage comparator 204, terminals 205, 206 and 207, and an instantaneous voltage drop process signal generating section 208. The resistor 202 and capacitor 203 constitute an integrator which serves as a charging and discharging circuit adapted to detect a DC power source voltage drop time.

The operation of the prior art instantaneous voltage drop detector having the above construction will be described with reference also made to FIGS. 3A to 3C. When a reset condition continues over a substantial period of time as represented by a period A in FIGS. 3A to 3C, the electric charge stored on the capacitor 203 is sufficiently discharged. In this condition, the terminals 205, 206 and 207 individually have a low level.

Assume that a reset condition, which has continued for a substantial period of time, is cleared such as upon the turn-on of the power source to turn the voltage on the terminal 205 to a high level as represented by a period B in FIGS. 3A to 3C. Then, since the capacitor 203 has been sufficiently discharged, the voltage on the output terminal 206 of the reset signal generating circuit 102 is gradually raised on the basis of the time constant of the integrator 209 which is constituted by the resistor 202 and capacitor 203. Consequently, a low-level signal is continuously delivered from the output terminal 207 of the voltage comparator 204 until the voltage appearing on the terminal 206 reaches a reference voltage $V_{ref}$, as indicated in the period B in FIGS. 3B and 3C. Upon the lapse of a sufficiently long period of time, the electric charge is stored sufficiently on the capacitor 203, so that the voltage on the terminal 206 rises above the reference level $V_{ref}$ with the result that, as represented in the period B in FIG. 3C, a high-level signal appears on the output terminal 207 of the voltage comparator 204.

When a reset signal appears on the terminal 205 due to a fall of the source voltage as in a period C or D in FIG. 3A, the electric charge stored on the capacitor 203 is discharged via the resistor 202 and reset signal generating circuit 102 so that the voltage on the terminal 206 is gradually lowered. If the duration of such a drop of the source voltage is short, the voltage on the terminal 206 remains higher than the reference voltage $V_{ref}$ as in the period C shown in FIG. 3B and, therefore, the high-level signal continuously appears on the output terminal 207 of the voltage comparator 204 as in the period C in FIG. 3C.

Assume that the duration of the voltage drop has exceeded a predetermined period of time T which is determined by the time constant of the integrating circuit 209 and the reference voltage $V_{ref}$, as represented by the voltage on the terminal 205 as the period D in FIG. 3A. Then, the voltage on the terminal 206 becomes lower than the reference voltage $V_{ref}$, as presented in the period D in FIG. 3B, resulting that a low-level signal appears on the output terminal 207, of the voltage comparator 204, as presented by the period D in FIG. 3C.

It will be seen from the operation occuring in the periods A to D in FIGS. 3A to 3C that the prior art instantaneous voltage drop detector determines whether the duration of a voltage drop of a DC power source is long or short on the basis of the level of a signal which appears on the terminal 207 of the voltage comparator 204 immediately after the reset state has been cleared.

Further, the signals appearing on the terminals 205 and 207 are applied to the instantaneous voltage drop process signal generating section 208. In response, the section 208 delivers a control signal to the TR 104 for commanding the latter into a start operation and the like.

By the construction and operation described above, a mobile radiotelephone is allowed to regain its communicating ability even when an instantaneous voltage drop occurs.

However, a problem with the prior art device described above is that when the instantaneous voltage drop occurs twice at a short interval as shown in a period E in FIG. 3A, the voltage on the terminal 206 becomes lower than the reference voltage $V_{ref}$ to cause a low-level signal to appear on the terminal 207 as shown in the period E in FIG. 3B and 3C and, therefore, the device erroneously detects a long-period voltage drop. This problem stems from the fact that the previously stated integrating circuit has a charging time constant and a discharging time constant which are equal to each other.

Referring to FIG. 4, an instantaneous voltage drop detector embodying the present invention is shown. As shown, the detector is made up of a reset signal generating circuit 102, a voltage comparator 204, a charging circuit 403, an integrating circuit 440, and a D-type flip-flop 416 which serves as a detecting and storing circuit. The integrating circuit or integrator 440 includes a resistor 202 and a capacitor 203. When the reset signal generating circuit 102 produces a reset signal, a voltage stored on the capacitor 203 is discharged via the resistor 202. The voltage comparator 204 compares an output voltage of the integrator 440, i.e., a voltage appearing on a terminal 406 with a reference voltage $V_{ref}$. The result of comparison is fed to the D-type flip-flop 416. Thus, the flip-flop 416 latches a signal level which appears on an output terminal 407 of the voltage comparator 204 when a reset condition is cleared, delivering the result via a terminal 417.

The charging circuit 403 includes a transistor 408 which plays the role of a switching device, a control circuit 430 for on-off controlling the transistor 408, and a diode 414. After the flip-flop 416 has latched by output of the voltage comparator 204, the charging circuit 403 rapidly charges the capacitor 203 of the integrator 440. More specifically, the transistor 408 functions to rapidly charge the capacitor 203 after a reset condition has been cleared.

The control circuit 430 in the charging circuit 403 includes resistors 409, 411 and 412, a transistor 410, and a capacitor 413 and controls the conduction of the transistor 408 slightly later than a positive-going edge of an output of the reset signal generating circuit 102.

The diode 414 in the charging circuit 403 rapidly discharges the capacitor 413 upon the appearance of a reset signal to thereby turn off the transistors 410 and 408 rapidly.

As described above, the charging circuit 403 turns on the transistor 408 upon the cancellation of a reset condition so as to charge the capacitor 203 rapidly.

The operation of the device of FIG. 4 having the above construction will be described with reference to FIGS. 5A, 5B, 5C, 5D and 5E. FIGS. 5A, 5B, 5C, 5D and 5E are timing charts representative of voltages appearing on terminals 405, 415, 406, 407 and 417 in FIG. 4, respectively. When a reset condition continues over a substantial period of time as in a period F of FIG. 5A, the electric charge stored on the capacitor 203 is sufficiently discharged and, at this instant, the voltage on the terminal 415 has a low level as shown in the period F of FIG. 5B. Immediately after the turn-on of a power source, the capacitor 203 is not charged. Hence, at the instant when a reset condition is cleared, the voltage on the terminal 406 is lower than the reference voltage $V_{ref}$, as shown in the period F of FIG. 5C. In this condition, the signal on the terminal 407 of the voltage comparator 204 has a low level, as shown in the period F of FIG. 5D. The D-type flip-flop 416, therefore, latches the low-level signal when the power source is turned on, so that a low-level signal appears on the output terminal 417 of the flip-flop 416, as shown in the period F of FIG. 5E.

The voltage on the terminal 415 is gradually raised upon the cancellation of a reset condition by a time constant which is determined by the resistors 411 and 412 and capacitor 413, as shown in the period G of FIG. 5B. As a base current begins to flow in transistor 410 in response to such a rise of the voltage, the collector and emitter of the transistor 410 are rendered conductive with the result that the transistor 408 is turned on. Then, the transistor 408 charges the capacitor 203 rapidly. Thus, the charging time constant of the integrating circuit 440 is far smaller than that of the prior art shown in FIG. 2.

The electric charge of the capacitor 203 which is charged as mentioned above, i.e., the voltage appearing on the terminal 406 becomes higher than the reference voltage $V_{ref}$, as shown in the period G of FIG. 5C. Consequently, the voltage comparator 204 produces a high-level signal on its output terminal 407. However, since a positive-going edge of the signal (write enable signal) has not yet been applied from the terminal 405 to the D-type flip-flop 416, a low-level signal continuously appears on the terminal 417, as shown in the period G of FIG. 5E.

When the source voltage is lowered beyond a predetermined level, a low-level signal appears on the terminal 405 of the reset signal generating circuit 102, as shown in the period H of FIG. 5A. Then, the electric charge stored on the capacitor 203 is freely discharged via the resistor 202 while, at the same time, the electric charge of the capacitor 413 is rapidly discharged via the diode 414. As a result, the voltage on the terminal 415 is rapidly lowered to turn off the transistor 410 and therefore the transistor 408. The discharging time constant of the integrating circuit 440 is therefore determined by the capacitor 203 and resistor 202, i.e., it is the same as the discharging time constant of the prior art shown in FIG. 2.

The voltage on the terminal 406 is also gradually lowered according to the discharging time constant of the integrating circuit 440, as shown in the period H of FIG. 5C. However, since the voltage on the terminal 406 is not lowered beyond the reference voltage $V_{ref}$, a high-level signal is fed to the terminal 407, as shown in the period H of FIG. 5D. Here, this reference voltage $V_{ref}$ and the time constant of the integrator 440 decide an instantaneous voltage drop decision time to be described later. Receiving the voltage on the terminal 407 and the positive-going edge of the signal on the terminal 405, the flip-flop 416 delivers a high-level signal to the terminal 417, as shown in the period H of FIG. 5E.

Assume that another instantaneous voltage drop has occurred in the power source in a period I immediately after the instantaneous voltage drop in the period H. The reset signal generating circuit 102 detects the voltage drop and produces a voltage on the terminal 405, as shown in the period I of FIG. 5A. Then, the voltage on the terminal 415 is varied as shown in the period I of FIG. 5B by the same circuit operation as in the period H. Hence, the voltage on the terminal 406 does not become lower than the reference voltage $V_{ref}$ as shown in the period I of FIG. 5C and therefore maintains the voltages on the terminals 407 and 417 at a high-level as shown in the period I of FIGS. 5D and 5E.

It will be seen from the above that the charging time constant of the integrator 440 is far smaller than the discharging time constant of the same and therefore prevents instantaneous voltage drops which may occur at a short interval from fooling the comparator into believing an instantaneous voltage drop of a time period $T_1$ or greater has occurred.

Further, assume that a voltage drop exceeding the decision time $T_1$ which is determined by the time constant of the integrator 440 and the reference voltage $V_{ref}$ has occurred in the DC power supply in a period J. In this period, too, the circuitry is operated in the same manner as discussed above. Specifically, the reset signal generating circuit 102 sensed such a voltage drop produces a voltage on the terminal 405 as shown in the period J of FIG. 5A. Hence, a voltage shown in the period J of FIG. 5B appears on the terminal 415. The voltage on the terminal 406 is also gradually lowered based on the discharging time constant of the integrator 440 and, as the time T₁ expires, becomes smaller than the reference level $V_{ref}$. Upon the lapse of the time T₁, the voltage on the terminal 407 turns to a low-level signal. In response to the positive-going edge of the voltage on the terminal 405, the D-type flip-flop 416 produces the instantaneous voltage on the terminal 407, i.e., low level on its output terminal 417.

Concerning the instantaneous voltage drop decision time T₁, assume that the source voltage is V₁, the capacitance of the capacitor 13 is C, and the resistance of the resistor 202 is R. Then, the voltage V appearing on the terminal 406 upon the lapse of a period of time T after the occurrence of a reset condition is expressed as:

$$V = V_1 e^{-\frac{T}{CR}} \quad (1)$$

The instantaneous voltage drop decision time T₁ is decided such a time that the voltage V on the terminal 406 equals to the reference voltage $V_{ref}$, which is defined by:

$$T_1 = CR \log e \frac{V_{ref}}{V_1} \quad (2)$$

When the reset condition is cleared before the period of time T₁ expires, a positive-going edge of the signal (write enable signal) is fed to the D-type flip-flop 416 with the result that a high-level signal appears on the output terminal 417 of the flip-flop 416. When the reset condition is cleared after the expiration of the period of time T₁, a low-level signal appears on the terminal 417.

The voltage on the terminal 417 is fed to the TR 104 (FIG. 1). The TR 104 executes start processing in response to the high-level signal on the terminal 417 i.e., in response to an instantaneous voltage drop process signal. However, when the source voltage is lower than a predetermined level, the TR 104 is inoperable and therefore cannot respond to the instantaneous voltage drop process signal. Stated another way, the instantaneous voltage drop process signal is effective only when the source voltage is restored to normal after an instantaneous voltage drop.

As described above, the circuitry shown in FIG. 4 surely distinguishes between closely occurring short duration instantaneous voltages drops and long duration instantaneous voltage drops, and delivers an instantaneous voltage drop process signal to the TR 104 in response to a long duration instantaneous voltage drop.

Figure 6:
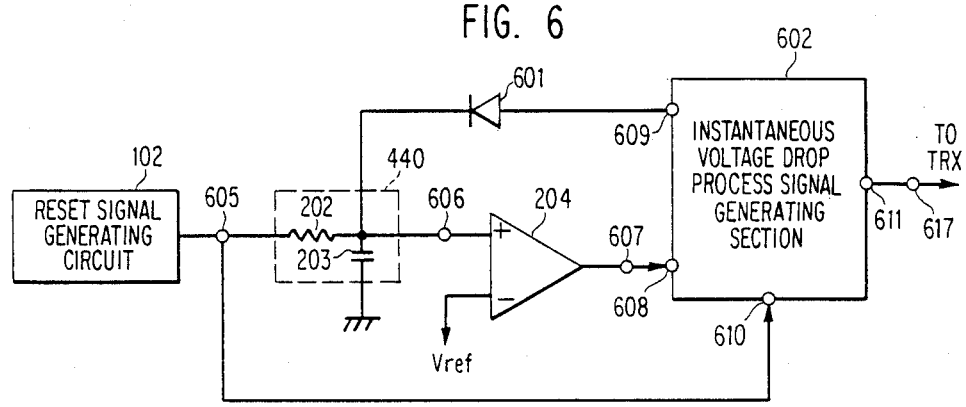
FIG. 6 is a schematic diagram showing an alternative embodiment of the present invention.

Referring to FIG. 6, an alternative embodiment of the present invention is shown. A major difference of this embodiment from the previous embodiment of FIG. 4 is that an instantaneous voltage drop process signal generating section 602 and a diode 601 are used in place of the charging circuit 403 and D-type flip-flop 416. Terminals 605, 606, 607 and 617 correspond respectively to the terminals 405, 406, 407 and 417 which are shown in FIG. 4. The signal generating section 602 is provided with input ports 608 and 610 and output ports 609 and 617.

A reference will be made to FIG. 7 for describing a specific control procedure executed by the instantaneous voltage drop process signal generating section 602 as well as the general operations of the circuitry of FIG. 6.

Figure 7:
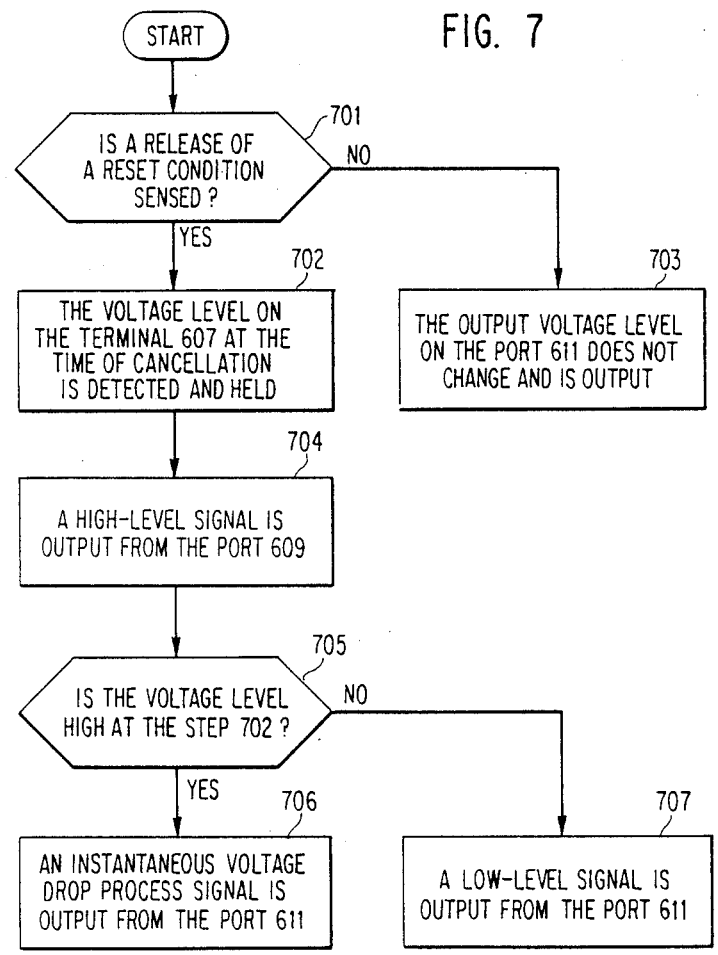
FIG. 7 is a flowchart demonstrating a specific control procedure associated with an instantaneous voltage drop process signal generating section which is shown in FIG. 6.

The procedure shown in FIG. 7 begins with a step 701 for sensing the release of a reset condition, i.e., a positive-going edge by referencing the voltage on the terminal 605 which is applied to the input port 610. If the release is not sensed, the output voltage level on the output port 611 does not change and a low-level signal appears on the output port 609. If the release is sensed, the program advances to a step 702 to detect and hold an instantaneous voltage level which has appeared on the terminal 607 at the time of release and been applied to the input port 608. The step 702 is followed by a step 704 in which a high-level signal is produced on the output port 609, and then by a step 705. The high-level output on the output port 609 is fed to the integrator 440 via the diode 601, whereby the capacitor 203 is rapidly charged. In the step 705, a high-level signal, i.e., an instantaneous voltage drop process signal is produced on the output port 611 if the voltage level held in the step 702 is high while a low-level signal is produced on the output port 611 if it is low. The integrator 440 and voltage comparator 204 are exactly the same as those shown in FIG. 4 with respect to the operations.

By the control and circuit operation stated above, voltages are produced on the terminals 605, 606, 607 and 617 as represented by timing charts which are analogous to the timing charts shown in FIGS. 5A, 5C, 5D and 5E and associated with the terminals 405, 406, 407 and 417, respectively.

In summary, it will be seen that the present invention provides an instantaneous voltage drop detector in which a charging and a discharging time constant of a charging and discharging circuit used for the detection of a DC power source voltage drop time are set independently of each other by a simple circuit or a simple control. The device is therefore surely prevented from failing to sense instantaneous voltage drops which may occur continuously at a short interval.

What is claimed is:

1. A device for detecting an instantaneous voltage drop of a DC power source, comprising:
   first means for producing a low-level signal having a duration associated with a period of time in which a voltage of said power source remains lower than a predetermined level, and a high-level signal having a duration associated with a period of time in which the voltage of said power source remains higher than said predetermined level;
   time constant circuit means having a predetermined time constant and being charged and discharged by the output of said first means;
   second means responsive to the output changing of said first means from said low-level signal to high-level signal for rapidly charging said time constant circuit means; and
   third means for comparing the output level of said time constant circuit means with a reference voltage level to produce a voltage drop signal.

2. A device as claimed in claim 1, further comprising fourth means responsive to said voltage drop signal at the rising timing of said high-level signal for producing an instantaneous voltage drop detect signal.

3. A device as claimed in claim 1, wherein said third means comprises a voltage comparing circuit.

4. A device as claimed in claim 1, wherein said DC power source comprises a battery mounted on a motor vehicle.

5. A device for detecting an instantaneous voltage drop of a DC power source, comprising:
   reset signal generating means for generating a reset signal by detecting a drop of a voltage of said power source below a predetermined level and a reset release signal which clears said reset signal by sensing a rise of the voltage of said power source above said predetermined level;

time constant circuit means having a predetermined time constant and being charged and discharged by said reset signal generating means;

means for rapidly charging said time constant circuit means in the presence of said reset release signal; and means for comparing the output voltage of said time constant circuit means with a predetermined reference voltage to produce a voltage drop signal.

6. A device as claimed in claim 5 further comprising means responsive to said voltage drop signal at the rising timing of said reset release signal for producing an instantaneous voltage drop detect signal.

7. A device for detecting an instantaneous voltage drop of a DC power source, comprising:

first means for producing a first signal having a duration associated with a period of time in which a voltage of said power source remains lower than a predetermined level, and a second signal having a duration associated with a period of time in which the voltage of said power source remains higher than said predetermined level;

time constant circuit means having a predetermined time constant and being charged and discharged by the output of said first means;

second means responsive to the output changing of said first means from said first signal to said second signal for changing the charge and discharge operations of said time constant circuit means, and for making either one of said charge and discharge operations fast; and third means for comparing the level of the output of said time constant circuit means with a reference voltage level to produce a voltage drop signal.

8. A device as claimed in claim 7, wherein said time constant circuit means comprises an RC time constant circuit having a resistor and a capacitor.

9. A device as claimed in claim 7, wherein said first and second signals are high- and low-level signals, respectively.

* * * * *